United States Patent [19]

Leyland

[11] Patent Number: 5,136,119
[45] Date of Patent: Aug. 4, 1992

[54] LIGHTWEIGHT PORTABLE EMI SHIELDING CONTAINER

[75] Inventor: Walter E. Leyland, Riverside, Calif.

[73] Assignee: The United States of America as Represented by the Secretaty of the Navy, Washington, D.C.

[21] Appl. No.: 761,562

[22] Filed: Sep. 18, 1991

[51] Int. Cl.$^5$ .............................................. H05K 9/00
[52] U.S. Cl. ............................ 174/35 R; 174/35 MS
[58] Field of Search ...................... 174/35 R, 35 MS; 361/424; 219/10.55 D, 10.55 R; 220/4.01, 4.02

[56] References Cited

U.S. PATENT DOCUMENTS

| | | | |
|---|---|---|---|
| 3,390,491 | 7/1968 | Hayden et al. | 174/35 R |
| 3,572,499 | 3/1971 | Mondano | 174/35 R |
| 4,068,087 | 1/1978 | Ristig | 174/35 MS |
| 4,785,136 | 11/1988 | Mollet et al. | 174/35 R |
| 4,896,001 | 1/1990 | Pitts et al. | 174/35 MS |

Primary Examiner—Leo P. Picard
Assistant Examiner—Bot Lee Ledynh
Attorney, Agent, or Firm—William C. Townsend; Kenneth W. Dobyns

[57] ABSTRACT

The invention relates to a Faraday cage for use with relatively unshielded electrical instruments to allow the instruments to be used in an environment of high electromagnetic interference. The cage is constructed of lightweight plastic material and is designed to be portable. It is a rigid cage when unfolded for use, yet is capable of being folded into a compact one-piece, substantially flat, stowable package, which can be erected for use with a minimum of effort.

8 Claims, 3 Drawing Sheets

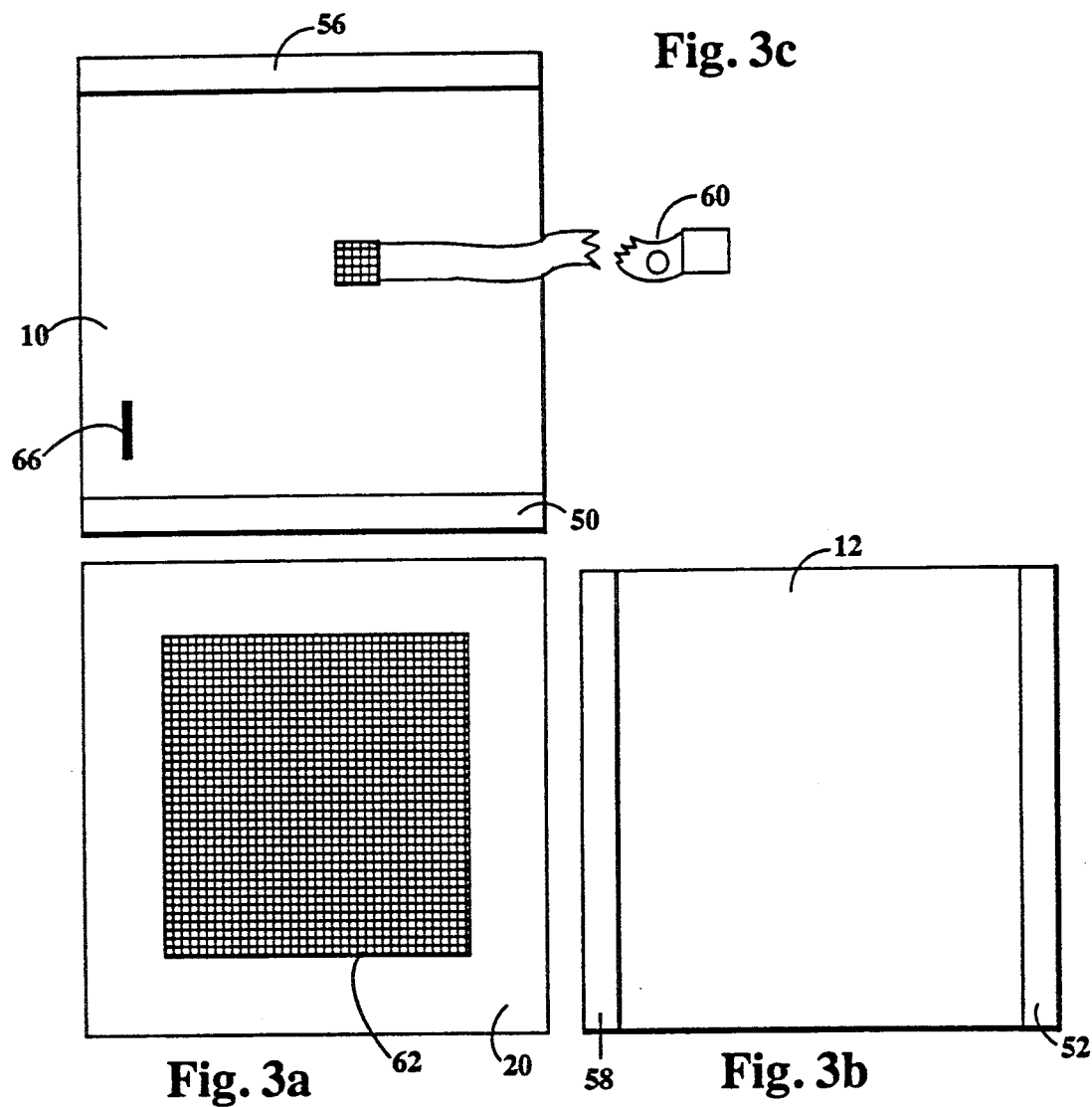

LIGHTWEIGHT PORTABLE EMI SHIELDING CONTAINER

BACKGROUND OF THE INVENTION

1. Field of the Invention

The invention relates to a Faraday cage designed to allow relatively unshielded commercial test equipment to operate in environments of high electromagnetic interference (EMI) without adverse effect, and to be lightweight, portable, and stowable in a small amount of space when not in use.

2. Description of the Prior Art

U.S. Pat. No. 4,785,136 discloses a shielding cover for electronic equipment in which a five-sided box is permanently sewn together from conductive fabric and placed over the equipment, possibly with the aid of a rigid frame, and attached to a conductive bottom piece of the box with means such as Velcro. To the extent that this cover is self-supporting, it is not foldable for stowage, and to the extent that it is foldable for stowage, it is not self-supporting.

U.S. Pat. No. 3,390,491 discloses an inflatable tent used as a shielding cover for electronic equipment. While this is collapsible for stowage, it is far too complex for use in shielding single pieces of equipment, and requires the operator to enter the inflated structure through an air-tight door.

U.S. Pat. No. 4,068,087 discloses a prefabricated shielded cabin composed of rigid panels which can be assembled around a frame of solid tubes and half tubes, and can be disassembled for easy transportation The complexity is suited to a large structure, but is not appropriate for a simple structure to shield single pieces of equipment.

OBJECT OF THE INVENTION

Commercial test equipment, such as volt meters, oscilloscopes, etc., are built in accordance with Federal Communications Commission (FCC) regulations to permit operation in EMI fields of up to one volt per meter. However, in some environments, fields of from five volts per meter to twenty-five volts per meter are encountered. Obtaining test equipment built to operate in a field of five volts per meter would multiply the cost by a factor of up to five, and test equipment capable of operating properly in a field of twenty-five volts per meter is unobtainable. High levels of EMI cause inaccurate readings of the test equipment and inaccurate settings of the equipment being tested and adjusted.

It is an object of the invention to provide a lightweight, portable, compact Faraday cage for use in environments where it is necessary to protect test equipment from high levels of EMI signals, to allow proper operation of this test equipment with consequent improved reliability of the equipment being tested.

SUMMARY OF THE INVENTION

Faraday cages are well known. The invention relates to the construction of a Faraday cage which is made of lightweight materials and which is a box in the shape of an orthogonal hexahedron, preferably a cube. The box is collapsible down to a flat package, and is easily erected to cover a test instrument while shielding it from EMI from outside the cage. At least one thin sheet of metallized fabric is used in connection with at least one sheet of rigid plastic to provide both support and shielding for the sides of the cage. Two opposite ends of the cage are hinged to the four remaining sides to provide a cage which is rigid when erected with the ends sealed to the sides, and which is capable of being collapsed into a package of small thickness when collapsed.

BRIEF DESCRIPTION OF THE DRAWINGS

FIGS. 3a, 3b, and 3c are respectively front, side and top views of the embodiment of FIG. 1.

DESCRIPTION OF THE PREFERRED EMBODIMENT

Figure 1:
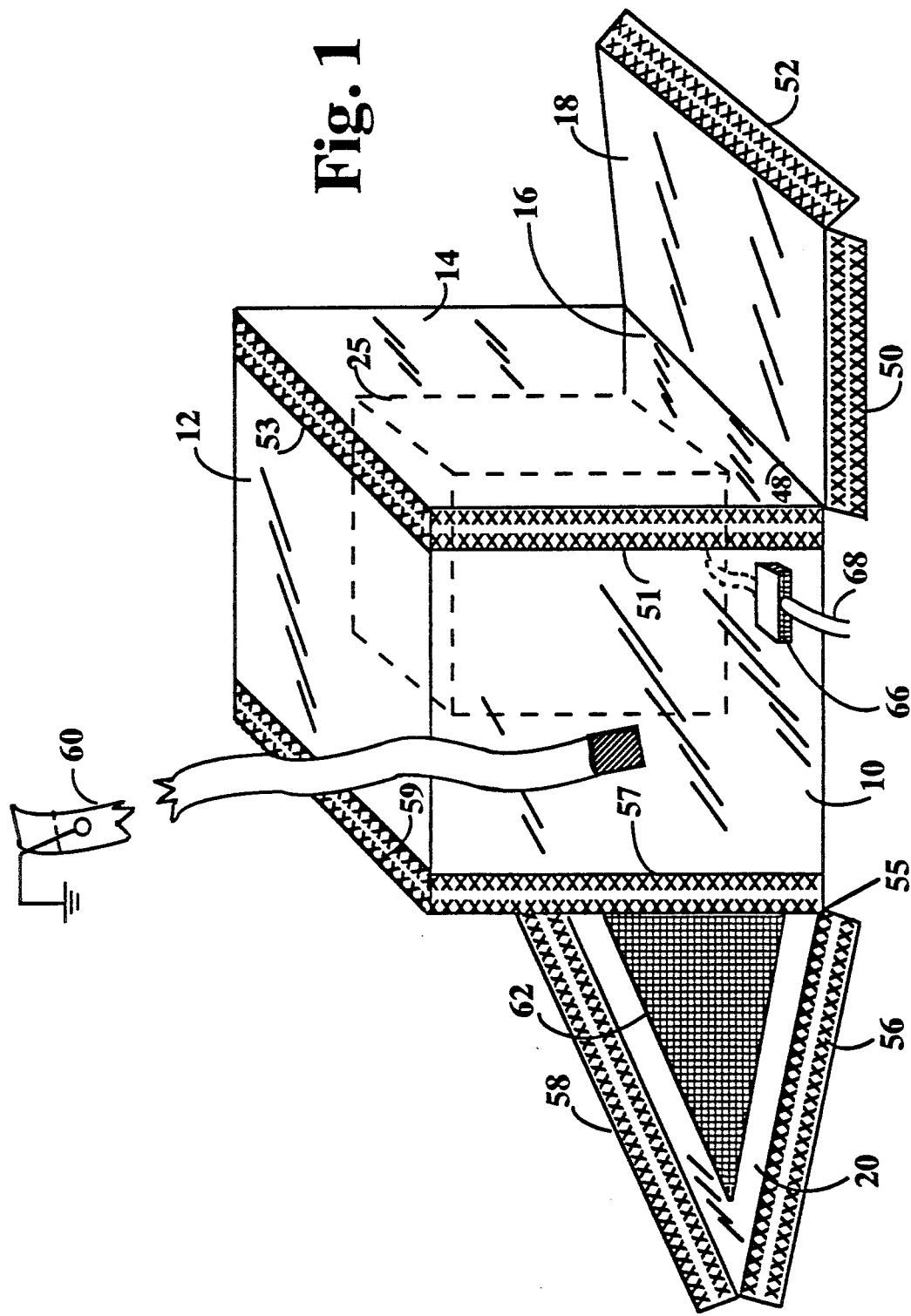
FIG. 1 is a perspective view of an embodiment of the invention.

FIG. 1 is a perspective view of a Faraday cage designed to be used with electronic equipment in areas of high EMI. It is a hexahedron, or box-form, consisting of six rectangular (preferably square) sides 10, 12, 14, 16, 18, 20, and preferably approximates a regular hexahedron or cube of sides approximately two feet along each edge. The dimensions can of course vary as necessary according to the use intended for the cage. All sides must shield against electric fields, and sides 10, 12, 14, and 16 must also be rigid and thus self-supporting, although preferably all six sides are rigid enough to stand alone. All edges are either constructed so as to be hinged, or so as to be sealed with material such as metallized Velcro While Velcro is a trademark for a particular type of material which works well with the invention, the term as used in this application is intended to be broad enough to cover similar material regardless of manufacturer. An electrical instrument 25 to be protected from EMI is shown in dotted lines in the cage, since the instrument itself is not a part of the invention.

Figure 2:
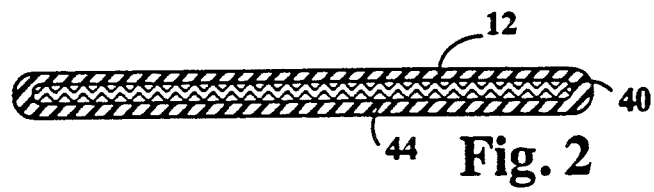
FIG. 2 is a sectional view of the material from which the rigid walls of the embodiment of FIG. 1 are constructed.
Figure 2A:
FIG. 2a is a detail showing a possible hinge for use with FIG. 2.

FIG. 2 illustrates a cross section of the sandwich of material in one of the walls. A rigid central panel of polyethylene or polypropylene plastic 40, which may be constructed of ribbed material, is sandwiched between two thin sheets of electromagnetically shielding plastic material 42, 44. Alternately, there may be only one layer of each type of plastic, or there may be one layer of electromagnetically shielding plastic material sandwiched by two layers of rigid plastic. There may also be additional layers of plastic where necessary, including a flexible durable material to increase the strength of the plastic material in the hinge areas. FIG. 2a shows that in the hinge areas around the edges of the cube, the rigid portion of the plastic is omitted from the sandwich. How far into the sides the rigid portion is omitted, or whether and reinforcement is needed in the vicinity of the hinges depends upon the precise materials used.

Since commercial electronic test equipment is built to operate properly in fields as high as one volt per meter, and since the cage described herein is designed to allow the equipment to operate in fields as high as twenty-five volts per meter, the electromagnetic attenuation or shielding effectiveness (in dB) will have to be at least twenty times the log base 10 of 25/1, or 28 dB, from 10 MHz to 10 GHz. For a margin of safety, a shielding effectiveness of 50 to 60 dB is recommended. The electromagnetically shielding plastic material can be a nylon ripstop or lightweight polyester fabric. The necessary sewing to sew the box together should be done with metallized or conductive thread to insure electrical conductivity through all six sides. All corner seams should be double sewn for added strength. The fabric may be coated with a material to protect the fabric from weather and salt spray. The fabric itself is inherently corrosion resistant. The fabric will be metallized, and is preferably the metallized fabric sold under the trademark Flectron by Monsanto Corporation. An acceptable performance is provided by 1.0 ounce/square-yard Cerex (nylon) nonwoven fabric with 0.5 ounce/square-yard of metal on the fabric. The metal may be copper, tin on copper, or nickel on copper, the best shielding being provided by copper.

Figure 4A:
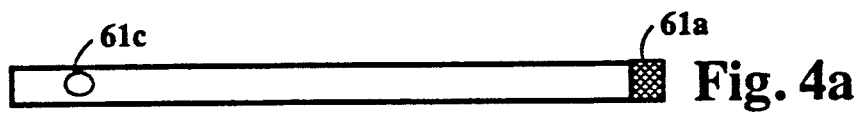
FIGS. 4a and 4b are top and bottom views of a securing and grounding strap as in FIG. 1.
Figure 4B:
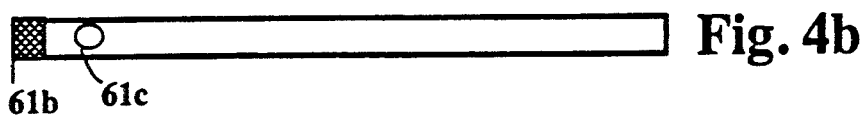

Referring again to FIG. 1, side 18 has a hinged edge 48 of the type shown in FIG. 2a to connect it with side 16, and it has flaps covered with metallized Velcro on the other three edges, the two visible ones of which are numbered 50 and 52. There are two complementary types of Velcro, hooks and pile, which interlock with each other. There are Velcro seat areas along the edges on sides 10, 12 and 14, the two visible ones of which, 51 and 53, are complementary to the flaps 50 and 52 with which they interlock. Similarly side 20 is hinged on one edge 55 to side 16 and includes flaps on the other three edges, the two visible ones of which are numbered 56 and 58. There are Velcro seat areas along the other set of edges on sides 10, 12 and 14, the two visible ones of which are numbered 57 and 59, and which interlock with the flaps on side 20. When the Velcro flaps are sealed with the complementary Velcro seat areas on the edges, the Faraday cage is sealed against EMI. I have found that the consistency of the seal as made by different people is improved if both flaps and seat areas are made by using two one-inch-wide strips of Velcro, separated by a distance of about a quarter inch, instead of using single strips of perhaps two inches in width. If either side 18 or 20 (or both) has its Velcro flaps sealed against the seat areas on the edges of sides 10, 12, and 14, the cage is rigidly upright, and does not collapse. A conductive strap 60 is provided with complementary Velcro areas, 61a and 61b (See FIGS. 4a and 4b), on opposite ends and opposite sides of the strap. When the cage is in use, the strap is used to connect it to ground. A metal grommet 61c through the strap adjacent the loose end of the strap facilitates making electrical contact through the strap to ground. When the cage is collapsed for stowage, the strap is used to hold the parts in a compact, flat package.

A metallized screen 62 is provided in side 20 as a viewing area for the electrical measuring instrument used in the cage. The screen is constructed of a metallized mesh of 100 to 150 openings per inch. The metal on the screen, at least on the outside is blackened to provide good visibility through it. The mesh preferably provides a minimum of 60 dB shielding from 10 MHz to 10 GHz.

At least one pair of metallized Velcro flaps 66, or equivalent sealable opening, is provided in at least one side of the cage for leading one or more wires, cables, etc., 68, into the cage while blocking EMI. As many sealable openings can be provided as are likely to be needed.

FIGS. 3a, 3b, and 3c provide end-on views of the erected cage from the directions, respectively, of sides 20, 12, and 10.

Figure 5A:
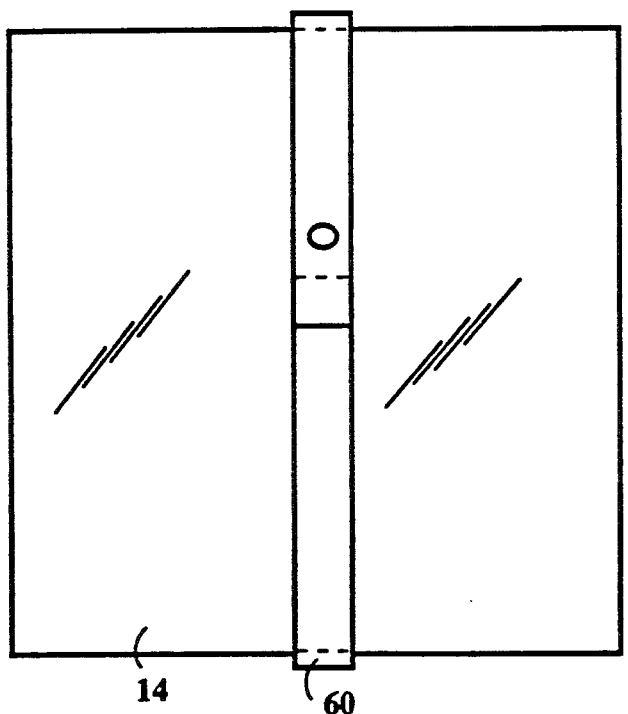
FIGS. 5a and 5b are top and side views of the device of FIG. 1 when collapsed and folded for stowage.
Figure 5B:
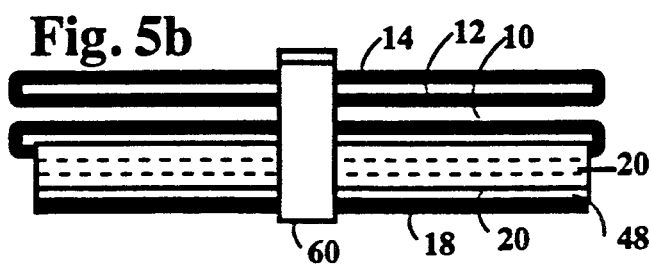

FIGS. 5a and 5b show a top view and an end-on view of the cage when it is collapsed and packaged for stowage. The cage is arranged so that the six sides lay flat against each other, and the stowage strap wraps around them to hold them in a compact flat package.

What is claimed is:

1. A collapsible Faraday cage shielding container for shielding an electrical instrument from high electromagnetic fields, comprising
   A. four rectangular pieces of plastic which are sufficiently rigid to stand alone and which have a strong attenuating effect on electromagnetic fields,
   B. hinging connectors for connecting two opposite edges of each of the four pieces with corresponding edges of two adjacent pieces of plastic to form four sides running around a box-form of six sides, the hinges being arranged to allow the four pieces to be collapsed into a flat configuration of approximately four times the thickness of any one of the four pieces, including the thickness of any fittings on the pieces, the box-form, when not collapsed, including rectangular openings at opposite ends,
   C. a fifth and a sixth rectangular piece of plastic, each having a strong attenuating effect on electromagnetic fields, each hinged at one of its edges over a respective one of the rectangular openings to a respective edge of one of the four rectangular pieces,
   D. metallized Velcro flaps on the three edges of the fifth and sixth pieces which are not hinged,
   E. corresponding metallized Velcro seats on the ones of the edges of the first four pieces which do not connect directly to hinges for receiving the flaps to seal the rectangular openings from electromagnetic fields,
   F. a sealable opening for allowing entrance of at least one cable to the cage while blocking electromagnetic fields from entering, and
   G. a visually transparent window in the sixth piece of plastic to allow viewing of the electrical instrument.

2. A container according to claim 1 in which the strong attenuating effect on electromagnetic fields includes at least 28 dB of attenuation from 10 MHz to 10 GHz.

3. A container according to claim 1 in which the box-form is approximately a cube.

4. A container according to claim 1 in which the fifth and six rectangular pieces of plastic are rigid.

5. A collapsible Faraday cage shielding container for shielding an electrical instrument from high electromagnetic fields, comprising
   A. six substantially square pieces of rigid plastic having a high attenuation factor for electromagnetic fields,
   B. means for hinging the pieces to form a collapsible cube, having openable and sealable doors at opposite ends of the cube,
   C. easily reversible sealing means having a high attenuation factor for electromagnetic fields for sealing the doors closed or for unsealing the doors when the cage is to be collapsed,
   D. sealable means for allowing at least one cable to enter the cage while attenuating electromagnetic fields entering at the same point, and E. a view window in one of the pieces to allow viewing of the instrument while attenuating electromagnetic fields entering through the view window.

6. A container according to claim 5, wherein the pieces of rigid plastic having a high attenuation factor comprise at least one layer of rigid plastic laminated with at least one layer of metallized fabric and the hinging means comprises the layer of metallized fabric without a corresponding backing of rigid material in the hinging areas.

7. A container according to claim 5, wherein the reversible sealing means comprises metallized Velcro flaps and seals along the edges of the doors and door openings which do not contain hinges.

8. A collapsible Faraday cage shielding container for shielding an electrical instrument from high electromagnetic fields, comprising A. four rectangular pieces of plastic, each comprising a sandwich of one piece of plastic which is sufficiently rigid to stand alone between two layers of metallized fabric which have a attenuating effect on electromagnetic fields of at least 28 dB from 10 MHz to 10 GHz, B. hinges for connecting two opposite edges of each of the four pieces with corresponding edges of two adjacent pieces of plastic to form four sides running around a box-form of six sides, the hinges being constructed as continuations of the two layers of metallized fabric from the four rectangular pieces without the layer of rigid plastic between them, the hinges being arranged to allow the four pieces to be collapsed into a flat configuration of approximately four times the thickness of any one of the four pieces, including the thickness of any fittings on the pieces, the box-form, when not collapsed, including rectangular openings at opposite ends, C. a fifth and a sixth rectangular piece of plastic, each having a similarly strong attenuating effect on electromagnetic fields, each hinged at one of its edges over a respective one of the rectangular openings to a respective edge of one of the four rectangular pieces, D. metallized Velcro flaps on the three remaining non-hinged edges of the fifth and sixth pieces, E. corresponding metallized Velcro seats on the ones of the edges of the four pieces first mentioned which do not connect directly to hinges for receiving the flaps to seal the rectangular openings from electromagnetic fields, F. a sealable opening for allowing entrance of at least one cable to the cage while blocking electromagnetic fields from entering, and G. a visually transparent window comprising metallized screen having a similarly strong attenuating effect on electromagnetic fields, set into the sixth piece of plastic to allow viewing of the electrical instrument.

* * * * *